(12) United States Patent
Chen et al.

(10) Patent No.: US 6,642,117 B1
(45) Date of Patent: Nov. 4, 2003

(54) METHOD FOR FORMING COMPOSITE DIELECTRIC LAYER

(75) Inventors: Chi-Chun Chen, Kaohsiung (TW); Tze-Liang Lee, Hsinchu (TW); Shih-Chang Chen, Taoyuan (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 0 days.

(21) Appl. No.: 10/213,117

(22) Filed: Aug. 5, 2002

(51) Int. Cl.$^7$ ............................................. H01L 21/336
(52) U.S. Cl. ..................... 438/287; 438/261; 438/591; 438/770; 438/775; 438/762
(58) Field of Search ................................. 438/287, 261, 438/591, 770, 775, 761, 762

(56) References Cited

U.S. PATENT DOCUMENTS

| | | | |
|---|---|---|---|
| 5,712,208 A | 1/1998 | Tseng et al. | 438/770 |
| 5,972,800 A * | 10/1999 | Hasegawa | 438/775 |
| 6,194,286 B1 | 2/2001 | Torek | 438/738 |
| 6,271,094 B1 | 8/2001 | Boyd et al. | 438/785 |
| 6,323,138 B1 * | 11/2001 | Doan | 438/775 |
| 6,348,380 B1 * | 2/2002 | Weimer et al. | 438/773 |
| 6,348,420 B1 * | 2/2002 | Raaijmakers et al. | 438/770 |
| 6,451,713 B1 * | 9/2002 | Tay et al. | 438/791 |
| 6,511,887 B1 * | 1/2003 | Yu et al. | 438/221 |

* cited by examiner

Primary Examiner—Michael Trinh
(74) Attorney, Agent, or Firm—Tung & Associates

(57) ABSTRACT

A method for forming a dielectric layer provides that a oxidizable substrate has formed thereupon a thermal oxide layer in turn having formed thereupon a deposited nitride layer. The deposited nitride/thermal oxide stack layer is then sequentially: (1) annealed within a nitriding atmosphere; (2) annealed within an oxidizing atmosphere; and (3) treated with a vaporous hydrofluoric acid atmosphere. The annealed and treated stack layer provides, for example, a gate dielectric layer with diminished thickness and enhanced performance.

14 Claims, 2 Drawing Sheets

METHOD FOR FORMING COMPOSITE DIELECTRIC LAYER

BACKGROUND OF THE INVENTION

1. Field of the Invention

The present invention relates generally to methods for forming dielectric layers within microelectronic products. More particularly, the present invention relates to methods for forming dielectric layers with enhanced performance within microelectronic products.

2. Description of the Related Art

Semiconductor products are formed from semiconductor substrates within and upon which are formed semiconductor devices and over which are formed patterned conductor layers which are separated by dielectric layers.

Common in the art of semiconductor fabrication are field effect devices. Field effect devices are generally conductor-dielectric-semiconductor devices where charge carrier concentration within a semiconductor channel region is modulated by charge injection into a conductor gate electrode separated from the semiconductor channel region by a gate dielectric layer. A particularly common field effect device is a metal oxide semiconductor field effect transistor (MOSFET) device.

While field effect devices such as MOSFET devices have become common in the art of semiconductor fabrication, field effect devices are nonetheless not entirely without problems.

In that regard, as field effect device dimensions have decreased, it has become increasingly difficult to fabricate gate dielectric layers with diminished thickness and enhanced performance.

It is thus towards the foregoing object that the present invention is directed.

Various methods have been disclosed within the semiconductor fabrication art for forming semiconductor devices and semiconductor structures with desirable properties.

Included among the methods, but not limited among the methods, are methods disclosed within: (1) Tseng et al., in U.S. Pat. No. 5,712,208 (a method for forming a composite gate dielectric layer for use within a field effect device); (2) Torek, in U.S. Pat. No. 6,194,286 (a method for selectively etching a thermally grown silicon oxide layer with respect to vapor deposited silicon oxide layer); and (3) Boyd et al., in U.S. Pat. No. 6,271,094 (a method for forming a field effect device with reduced overlap capacitance).

Desirable are additional methods for forming, with diminished thickness and enhanced performance, gate dielectric layers within field effect devices within semiconductor product.

It is towards the foregoing object that the present invention is directed.

SUMMARY OF THE INVENTION

A first object of the present invention is to provide a method for forming a gate dielectric layer for use within a field effect device within a semiconductor product.

A second object of the present invention is to provide a method in accord with the first object of the present invention, wherein the gate dielectric layer is formed with diminished thickness and enhanced performance.

In accord with the foregoing objects, the present invention provides a method for forming a dielectric layer.

To practice the method of the present invention, there is first provided an oxidizable substrate. There is then thermally oxidized the oxidizable substrate to form a thermal oxide layer thereupon. There is then deposited upon the thermal oxide layer a nitride layer to form a composite deposited nitride/thermal oxide stack layer upon the oxidizable substrate. There is then annealed the composite deposited nitride/thermal oxide stack layer within a nitriding atmosphere to form therefrom a nitrided composite deposited nitride/thermal oxide stack layer. There is then annealed the nitrided composite deposited nitride/thermal oxide stack layer within an oxidizing atmosphere to form therefrom an oxidized nitrided composite deposited nitride/thermal oxide stack layer. Finally, there is then treated the oxidized nitrided composite deposited nitride/thermal oxide stack layer with a vaporous hydrofluoric acid material.

Within the invention, the oxidizable substrate may include, but is not limited to, an oxidizable semiconductor substrate. The dielectric layer may similarly include, but is not limited to, a gate dielectric layer formed upon the oxidizable semiconductor substrate.

The present invention provides a method for forming, with diminished thickness and enhanced performance, a gate dielectric layer for use within a field effect device.

The present invention realizes the foregoing object by forming a deposited nitride/thermal oxide stack layer upon an oxidizable substrate, which may be an oxidizable semiconductor substrate. The deposited nitride/thermal oxide stack layer may be employed for forming a gate dielectric layer within the field effect device. The deposited nitride/thermal oxide stack layer is sequentially: (1) annealed within a nitriding atmosphere; (2) annealed within an oxidizing atmosphere; and (3) treated with a vaporous hydrofluoric acid material.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming, with diminished thickness and enhanced performance, a gate dielectric layer for use within a field effect device.

The present invention realizes the foregoing object by forming a deposited nitride/thermal oxide stack layer upon an oxidizable substrate, which may be an oxidizable semiconductor substrate. The deposited nitride/thermal oxide stack layer may be employed for forming a gate dielectric layer within the field effect device. The deposited nitride/thermal oxide stack layer is sequentially: (1) annealed within a nitriding atmosphere; (2) annealed within an oxidizing atmosphere; and (3) treated with a vaporous hydrofluoric acid material.

While the preferred embodiment illustrates the present invention within the context of forming a gate dielectric layer within a MOSFET device, the invention is not intended to be so limited. Rather, the present invention is applicable under circumstances where a dielectric layer is formed in part from a thermal oxide layer formed incident to thermal oxidation of an oxidizable substrate. The oxidizable substrate may be formed of a material selected from the group including but not limited to conductor, semiconductor and dielectric materials (i.e., various dopant concentrations within silicon materials provide conductor, semiconductor and dielectric silicon materials). The dielectric layer may be employed within devices including but not limited to field effect devices (such as MOSFETs) and capacitive devices. The devices may be employed within microelectronic products including but not limited to integrated circuit products (including semiconductor products), ceramic substrate products and optoelectronic products.

FIG. 1 to FIG. 7 show a series of schematic cross-sectional diagrams illustrating the results of progressive stages of fabricating upon a semiconductor substrate a MOSFET device in accord with the preferred embodiment of the present invention.

Figure 1:
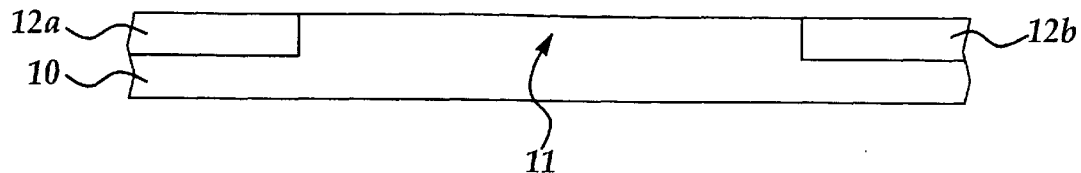
FIG. 1, FIG. 2, FIG. 3, FIG. 4, FIG. 5, FIG. 6 and FIG. 7 show a series of schematic cross-sectional diagrams illustrating the results of progressive stages of fabricating upon a semiconductor substrate a MOSFET device in accord with the preferred embodiment of the present invention.

FIG. 1 shows a schematic cross-sectional diagram of the semiconductor substrate at an early stage in its fabrication.

FIG. 1 shows a semiconductor substrate 10 having formed therein a pair of isolation regions 12a and 12b which define an active region 11 of the semiconductor substrate 10.

Within the invention, the semiconductor substrate 10 is formed of a semiconductor material which is susceptible to thermal oxidation to form a thermal oxide layer upon the semiconductor substrate 10. Such thermally oxidizable semiconductor materials typically include, but are not limited to, silicon semiconductor materials, germanium semiconductor materials and silicon-germanium alloy semiconductor materials. The semiconductor materials typically have incorporated therein dopants of appropriate concentration and polarity.

Within the invention, the pair of isolation regions 12a and 12b may be formed as isolation regions including but not limited to local oxidation of silicon (LOCOS) isolation regions and shallow trench isolation (STI) regions. Typically, the pair of isolation regions 12a and 12b is formed at least in part of a silicon oxide dielectric material.

Figure 2:
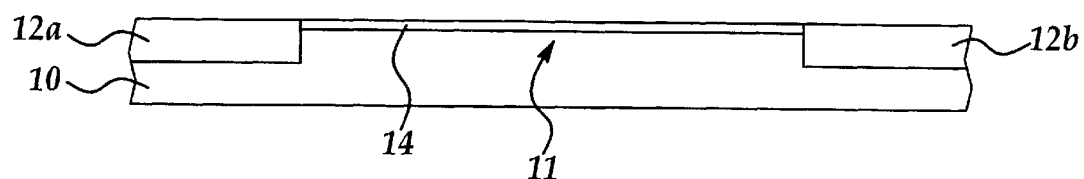

FIG. 2 illustrates the results of thermally oxidizing the semiconductor substrate 10 to form upon the active region 11 thereof a blanket thermal oxide layer 14.

Within the invention, the semiconductor substrate 10 is typically thermally oxidized at a temperature of from about 600 to about 1100 degrees centigrade for a time period of from about 5 to about 120 seconds to form the blanket thermal oxide layer 14 of thickness from about 5 to about 15 angstroms upon the active region 11 of the semiconductor substrate 10.

Figure 3:
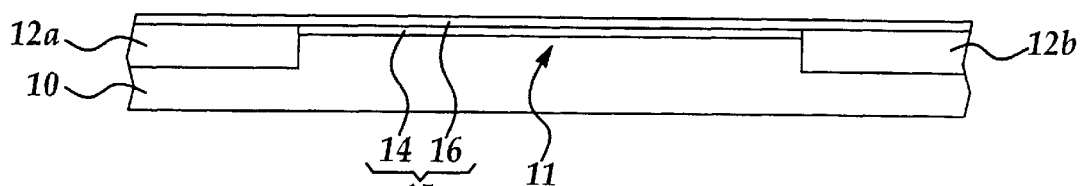

FIG. 3 illustrates the results of depositing a blanket deposited silicon nitride layer 16 upon exposed portions of the isolation regions 12a and 12b and the blanket thermal oxide layer 14. The blanket thermal oxide layer 14 and the blanket deposited silicon nitride layer 16 in an aggregate form a blanket deposited nitride/thermal oxide stack layer 15.

Within the invention, the blanket deposited silicon nitride layer 16 is preferably formed employing a chemical vapor deposition (CVD) method. Alternative methods may also be employed, including plasma enhanced chemical vapor deposition (PECVD) methods and physical vapor deposition (PVD) methods. Typically, the CVD method employs: (1) a reactor chamber pressure of from about 1 mTorr to about 50 torr; (2) a semiconductor substrate 10 (and overlying layers) temperature of from about 250 to about 750 degrees centigrade; (3) a silane flow rate of from about 5 to about 500 standard cubic centimeters per minute (sccm); and (4) an ammonia flow rate of from about 50 to about 5000 sccm. Typically, the blanket deposited silicon nitride layer 16 is formed to a thickness of from about 5 to about 30 angstroms.

Figure 4:
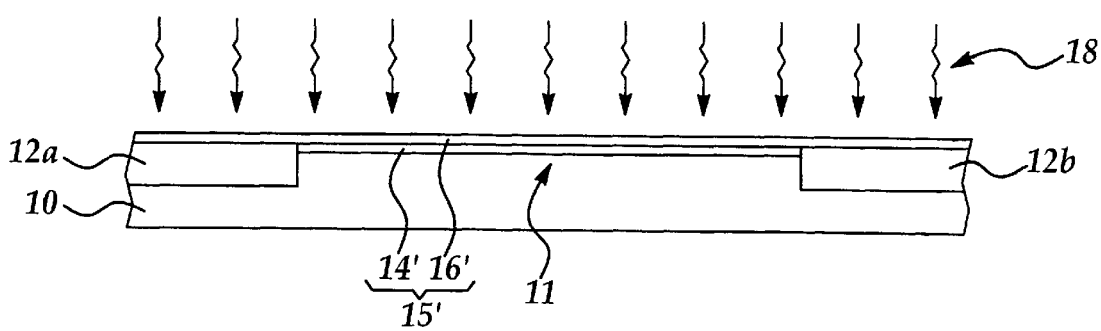

FIG. 4 illustrates the results of annealing the blanket deposited nitride layer 16 and the blanket thermal oxide layer 14 within a nitriding atmosphere 18 to form therefrom a corresponding blanket nitrided deposited nitride layer 16' and blanket nitrided thermal oxide layer 14'. The foregoing two blanket layers in an aggregate form a blanket nitrided deposited nitride/thermal oxide stack layer 15'.

Within the invention, the nitriding atmosphere 18 is typically a thermal nitriding atmosphere or plasma nitriding atmosphere. The nitriding atmosphere 18 preferably employs a nitriding gas such as but not limited to ammonia, or nitric oxide (NO) or nitrous oxide ($N_2O$) Typically, the nitriding atmosphere 18 is provided at: (1) a reactor chamber pressure of from about 10 to about 760 torr; (2) a semiconductor substrate 10 (and overlying layers) temperature of from about 650 to about 1000 degrees centigrade; (3) an ammonia nitriding gas at a flow rate of from about 50 to about 5000 sccm, and (4) a nitriding treatment time of from about 10 to about 120 seconds.

Figure 5:
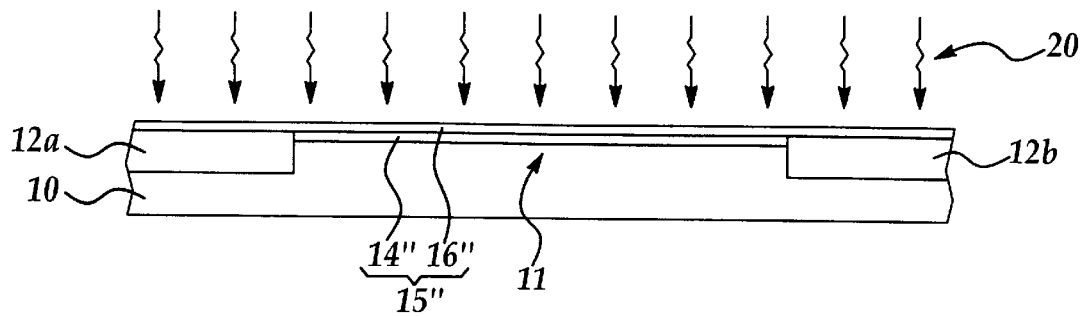

FIG. 5 shows the results of annealing the blanket nitrided deposited silicon nitride layer 16' and the blanket nitrided thermal oxide layer 14''' within an oxidizing atmosphere 20 to form therefrom a corresponding blanket oxidized nitrided deposited silicon nitride layer 16'' and blanket oxidized nitrided thermal oxide layer 14'''. The foregoing two blanket layers form in an aggregate a blanket oxidized nitrided deposited nitride/thermal oxide stack layer 15''.

Within the invention, the oxidizing atmosphere 20 is preferably a thermal oxidizing atmosphere or a plasma oxidizing atmosphere. The oxidizing atmosphere 20 typically employs an oxidant selected from the group including but not limited to oxygen, ozone, nitrous oxide and nitric oxide, with nitrous oxide more preferred. Typically, the oxidizing atmosphere 20 also employs: (1) a reactor chamber pressure of from about 10 to about 760 torr; (2) a semiconductor substrate 10 (and overlying layers) temperature of from about 650 to about 1000 degrees centigrade; (3) a nitrous oxide oxidant flow rate of from about 50 to about 5000 sccm; and (4) an oxidizing atmosphere 20 annealing time period of from about 10 to about 120 seconds.

Figure 6:
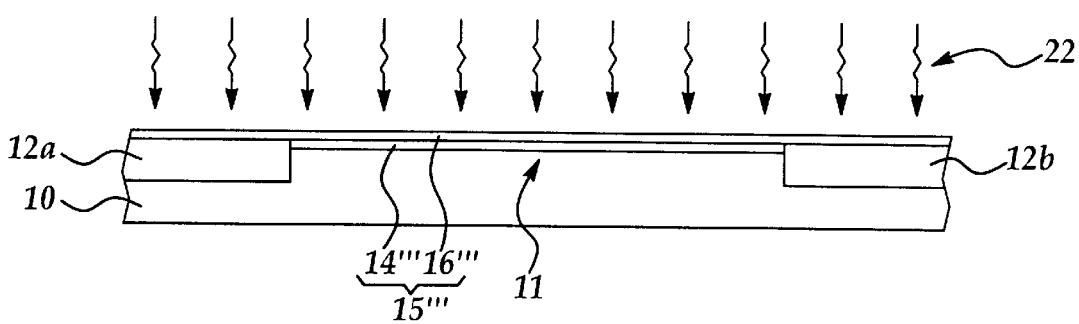

FIG. 6 illustrates the results of treating the blanket oxidized nitrided deposited nitride layer 16'' and the blanket oxidized nitrided thermal oxide layer 14'' with a vaporous hydrofluoric acid atmosphere 22 to form therefrom a corresponding blanket hydrofluoric acid treated oxidized nitrided deposited nitride layer 16''' and blanket hydrofluoric acid treated oxidized nitrided thermal oxide layer 14'''. The foregoing two blanket layers form in an aggregate a blanket hydrofluoric acid treated oxidized nitrided deposited nitride/ thermal oxide stack layer 15'''.

Within the invention, the vaporous hydrofluoric acid atmosphere 22 may be provided employing methods and apparatus as are otherwise generally conventional in the art of microelectronic fabrication. Typically, the vaporous hydrofluoric acid atmosphere 22 is a vaporous hydrofluoric acid atmosphere provided employing: (1) a reactor chamber pressure of about 10 to about 760 torr; (2) a semiconductor substrate 10 (and overlying layers) temperature of from about 0 to about 100 degrees centigrade; (3) a vaporous hydrofluoric acid flow rate of from about 1 to about 100 sccm; and (4) a vaporous hydrofluoric acid atmosphere 22 treatment time of from about 10 to about 120 seconds.

In accord with the example which follows, the vaporous hydrofluoric acid atmosphere 22 treatment provides for enhanced performance of the blanket hydrofluoric acid treated oxidized nitrided deposited nitride/thermal oxide stack layer 15''' when a portion thereof is employed as a gate dielectric layer within a MOSFET device.

Figure 7:
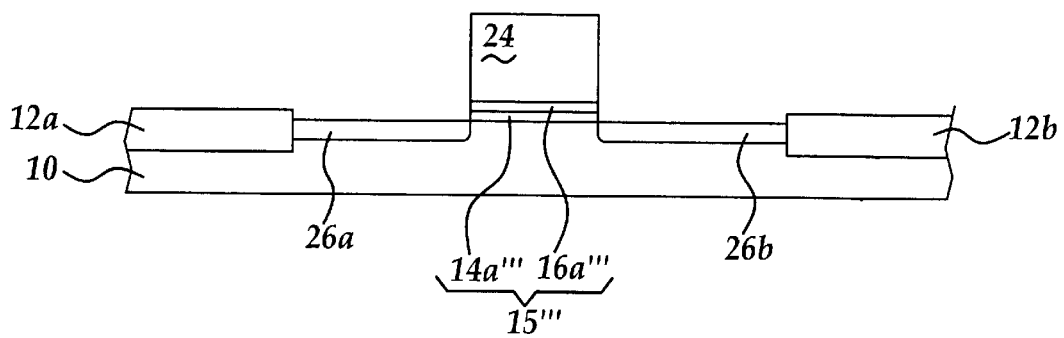

FIG. 7 illustrates the results of patterning the blanket hydrofluoric acid treated oxidized nitrided deposited nitride/thermal oxide stack layer 15''' to form therefrom a patterned hydrofluoric acid treated oxidized nitrided deposited nitride/thermal oxide stack layer 15a''' comprised of a patterned hydrofluoric acid treated oxidized nitrided deposited nitride layer 16a''' and a patterned hydrofluoric acid treated oxidized nitrided thermal oxide layer 14a'''. The patterned hydrofluoric acid treated oxidized nitrided deposited nitride/thermal oxide stack layer 15a''' serves as a gate dielectric layer within the MOSFET device. The MOSFET device further comprises: (1) a gate electrode 24 aligned upon the patterned hydrofluoric acid treated oxidized nitrided deposited nitride/thermal oxide stack layer 15a'''; as well as (2) a pair of source/drain regions 26a and 26b formed into the active region 11 of the semiconductor substrate 10 at areas not covered by the gate electrode 24.

Within the present invention, the blanket hydrofluoric acid treated oxidized nitrided deposited nitride/thermal oxide stack layer 15''' may be patterned to form the patterned hydrofluoric acid treated oxidized nitrided deposited nitride/thermal oxide stack layer 15a''' while employing etch methods as are conventional in the art of semiconductor fabrication. In addition, the gate electrode 24 may be formed employing methods and materials as are conventional in the art of semiconductor fabrication, and the source/drain regions 26a and 26b may also be formed employing methods and materials as are conventional in the art of semiconductor fabrication.

FIG. 7 illustrates a semiconductor product fabricated in accord with the preferred embodiment of the present invention. The semiconductor product has formed therein a MOSFET device with enhanced performance insofar as the MOSFET device has formed therein a gate dielectric layer formed with diminished thickness and enhanced performance. The gate dielectric layer is formed of a deposited nitride/thermal oxide stack layer. The deposited nitride/thermal oxide stack layer is sequentially: (1) annealed within a nitriding atmosphere; (2) oxidized within an oxidizing atmosphere; and (3) treated with a vaporous hydrofluoric acid atmosphere.

EXAMPLE

Two semiconductor substrates were fabricated generally in accord with the preferred embodiment of the invention. Each of the semiconductor substrates had defined therein a series of active regions having formed thereupon a series of deposited nitride/thermal oxide stack layers. The thermal oxide layers were formed to a thickness of about 10 angstroms incident to thermal oxidation of the pair of semiconductor substrates at a temperature of about 650 degrees centigrade for a time period of about 30 seconds. The deposited nitride layers were formed employing silane and ammonia source gases within a CVD method, to form the deposited nitride layers of thickness about 15 angstroms each.

The series of deposited nitride/thermal oxide stack layers were then annealed within an ammonia nitriding atmosphere followed by a nitrous oxide oxidizing atmosphere. The ammonia nitriding atmosphere was provided at: (1) a reactor chamber pressure of about 50 torr; (2) a semiconductor substrate (and overlying layers) temperature of about 750 degrees centigrade; (3) an ammonia nitriding gas flow rate of about 3000 sccm; and (4) a nitriding annealing time of about 30 seconds. The nitrous oxide oxidizing atmosphere was provided at: (1) a reactor chamber pressure of about 50 torr; (2) a semiconductor substrate (and overlying layers) temperature of about 850 degrees centigrade; (3) a nitrous oxide flow rate of about 5000 sccm; and (4) a nitrous oxide oxidizing annealing time of about 30 seconds.

One of the two semiconductor substrates then received a vaporous hydrofluoric acid treatment at: (1) a reactor chamber pressure of about 100 torr; (2) a semiconductor substrate (and overlying layers) temperature of about 25 degrees centigrade; (3) a vaporous hydrofluoric acid flow rate of about 5 sccm; and (4) a vaporous hydrofluoric acid treatment time of about 20 seconds.

Each of the pair of semiconductor substrates was further fabricated to form therein a series of MOSFET devices. Electrical parameters of the series of MOSFET devices were then measured. Results are reported in Table I.

TABLE I

| Gate Diel Trtmt | Equiv Oxide | Gate Current |
|---|---|---|
| vaporous HF | 20.4 A | 0.008 A/cm$^2$ |
| no vaporous HF | 17.0 A | 0.077 |

As is illustrated in Table I, an equivalent oxide thickness is favorably reduced and a gate current is favorably increased when forming within a MOSFET a gate dielectric layer in accord with the present invention. Thus, the MOSFET having formed therein the gate dielectric layer also has enhanced performance.

As is understood by a person skilled in the art, the preferred embodiment of the present invention is illustrative of the present invention rather than limiting of the present invention. Revisions and modifications may be made to structures and dimensions employed for fabricating a MOSFET in accord with the preferred embodiment of the present invention while still fabricating a dielectric layer in accord with the present invention, further in accord with the accompanying claims.

What is claimed is:

1. A method for forming a dielectric layer comprising:
   providing an oxidizable substrate;
   thermally oxidizing the oxidizable substrate to form a thermal oxide layer thereupon;
   depositing upon the thermal oxide layer a nitride layer to form a composite deposited nitride/thermal oxide stack layer upon the oxidizable substrate;
   annealing the composite deposited nitride/thermal oxide stack layer within a nitriding atmosphere to form therefrom a nitrided composite deposited nitride/thermal oxide stack layer;
   annealing the nitrided composite deposited nitride/thermal oxide stack layer within an oxidizing atmosphere to form therefrom an oxidized nitrided composite deposited nitride/thermal oxide stack layer; and
   treating the oxidized nitrided composite deposited nitride/thermal oxide stack layer with a vaporous hydrofluoric acid material.

2. The method of claim 1 wherein the oxidizable substrate is formed from a material selected from the group consisting of conductor materials, semiconductor materials and dielectric materials.

3. The method of claim 1 wherein:

the thermal oxide layer is formed to a thickness of from about 5 to about 15 angstroms; and the deposited nitride layer is formed to a thickness of from about 5 to about 30 angstroms.

4. The method of claim 1 wherein the nitriding atmosphere is a thermal nitriding atmosphere.

5. The method of claim 1 wherein the oxidizing atmosphere is a thermal oxidizing atmosphere.

6. The method of claim 1 wherein the vaporous hydrofluoric acid material is provided at a temperature of from about 0 to about 100 degrees centigrade for a treatment time of from about 10 to about 120 seconds.

7. The method of claim 1 wherein the dielectric layer is employed within a device selected from the group consisting of field effect devices and capacitive devices.

8. A method for forming a gate dielectric layer comprising:

providing a semiconductor substrate;

thermally oxidizing the semiconductor substrate to form a thermal oxide layer thereupon;

depositing upon the thermal oxide layer a nitride layer to form a composite deposited nitride/thermal oxide stack layer upon the semiconductor substrate;

annealing the composite deposited nitride/thermal oxide stack layer within a nitriding atmosphere to form therefrom a nitrided composite deposited nitride/thermal oxide stack layer;

annealing the nitrided composite deposited nitride/thermal oxide stack layer within an oxidizing atmosphere to form therefrom an oxidized nitrided composite deposited nitride/thermal oxide stack layer; and treating the oxidized nitrided composite deposited nitride/thermal oxide stack layer with a vaporous hydrofluoric acid material.

9. The method of claim 8 wherein the semiconductor substrate is selected from the group consisting of silicon substrates, germanium substrates and silicon-germanium alloy substrates.

10. The method of claim 8 wherein:

the thermal oxide layer is formed to a thickness of from about 5 to about 15 angstroms; and the deposited nitride layer is formed to a thickness of from about 5 to about 30 angstroms.

11. The method of claim 8 wherein the nitriding atmosphere is a thermal nitriding atmosphere.

12. The method of claim 8 wherein the oxidizing atmosphere is a thermal oxidizing atmosphere.

13. The method of claim 8 wherein the vaporous hydrofluoric acid material is provided at a temperature of from about 0 to about 100 degrees centigrade for a treatment time of from about 10 to about 120 seconds.

14. The method of claim 8 wherein the gate dielectric layer is employed within a MOSFET device.

* * * * *